(12) United States Patent
Cole

(10) Patent No.: US 7,952,357 B2
(45) Date of Patent: May 31, 2011

(54) RECEIVER SYSTEM FOR DETERMINING THE LOCATION OF A MAGNETIC FIELD SOURCE

(75) Inventor: Scott Bryan Cole, Edmond, OK (US)

(73) Assignee: The Charles Machines Works, Inc., Perry, OK (US)

( * ) Notice: Subject to any disclaimer, the term of this patent is extended or adjusted under 35 U.S.C. 154(b) by 761 days.

(21) Appl. No.: 11/863,903

(22) Filed: Sep. 28, 2007

(65) Prior Publication Data

US 2009/0085568 A1    Apr. 2, 2009

(51) Int. Cl.
*G01V 3/08* (2006.01)
(52) U.S. Cl. ............................ 324/326; 175/45
(58) Field of Classification Search .................. None
See application file for complete search history.

(56) References Cited

U.S. PATENT DOCUMENTS

| | | | |
|---|---|---|---|
| 4,390,836 A | 6/1983 | Bruce et al. | |
| 4,542,344 A | 9/1985 | Darilek et al. | |
| 4,742,356 A | 5/1988 | Kuipers | |
| 5,699,048 A | 12/1997 | Galloway | |
| 6,005,532 A | 12/1999 | Ng | |
| 6,035,951 A | 3/2000 | Mercer et al. | |
| 6,563,474 B2 | 5/2003 | Nantz et al. | |
| 6,865,455 B1 | 3/2005 | Wiegert | |
| 6,882,154 B2 | 4/2005 | Mercer et al. | |
| 6,924,767 B2 | 8/2005 | Kitahara et al. | |
| 7,009,399 B2 | 3/2006 | Olsson et al. | |
| 7,356,421 B2* | 4/2008 | Gudmundsson et al. | ........ 702/38 |
| 7,656,159 B2* | 2/2010 | Edelstein | ........................ 324/326 |
| 2009/0153141 A1* | 6/2009 | Mercer | .......................... 324/329 |
| 2010/0002938 A1* | 1/2010 | Mulcahey | ..................... 382/190 |

FOREIGN PATENT DOCUMENTS

| | | |
|---|---|---|
| DE | 19533105 A1 | 10/1996 |
| EP | 0045486 A3 | 10/1982 |
| EP | 1526606 A1 | 4/2005 |
| GB | 2006438 A | 5/1979 |
| JP | 2021288 A | 7/1988 |
| JP | 2003249816 A1 | 9/2003 |
| WO | 9530913 | 11/1995 |
| WO | 0010456 | 3/2000 |
| WO | 2006/124520 A3 | 11/2006 |

* cited by examiner

*Primary Examiner* — Jay M Patidar
(74) *Attorney, Agent, or Firm* — Tomlinson Rust McKinstry Grable

(57) ABSTRACT

A method and receiver system for identifying a location of a magnetic field source using two horizontally displaced tri-axial antennas. In a preferred embodiment two tri-axial antennas are positioned at opposite ends of a receiver frame. Each antenna detects in three dimensions a magnetic field from a source or transmitter. The receiver is maintained in a horizontal plane and the receiver is moved in the horizontal plane until a flux angle measured at each of the two points is zero so that the receiver is in the vertical plane perpendicular to the axis of the source. The depth and location of the source in three dimensions relative to the receiver is determined using the detected field values. The receiver is moved in a direction defined by a line containing the two points of the receiver until a magnitude of the magnetic field detected at each of the two points is substantially the same so that the receiver is positioned above the source.

11 Claims, 6 Drawing Sheets

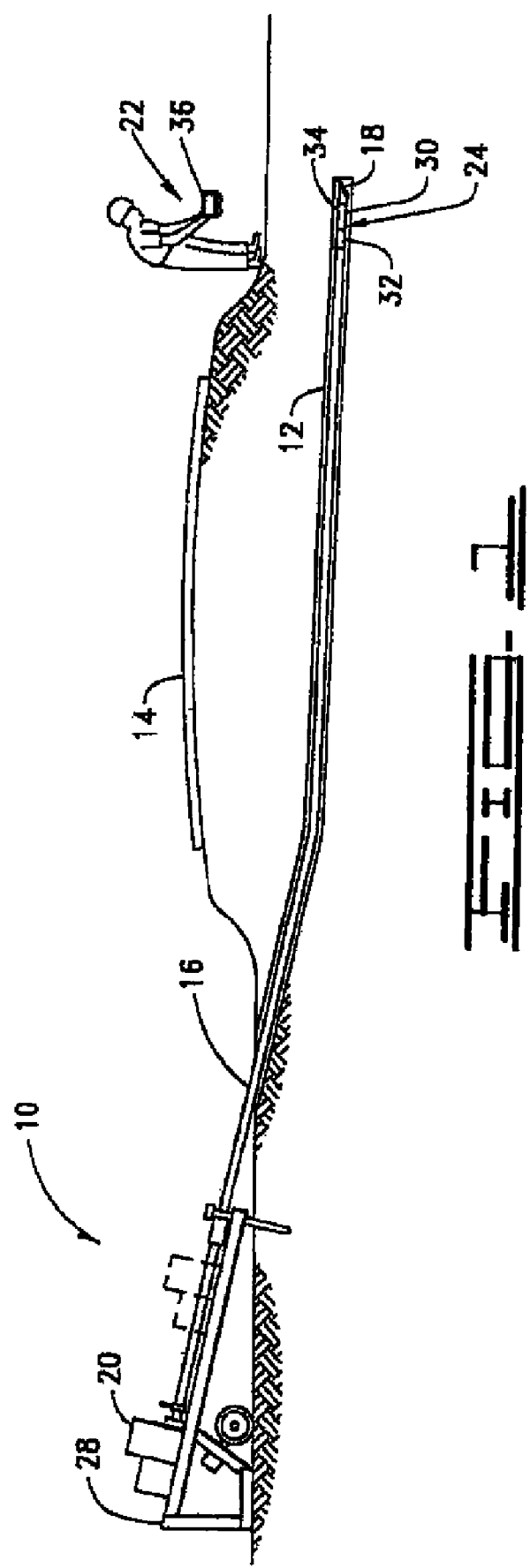

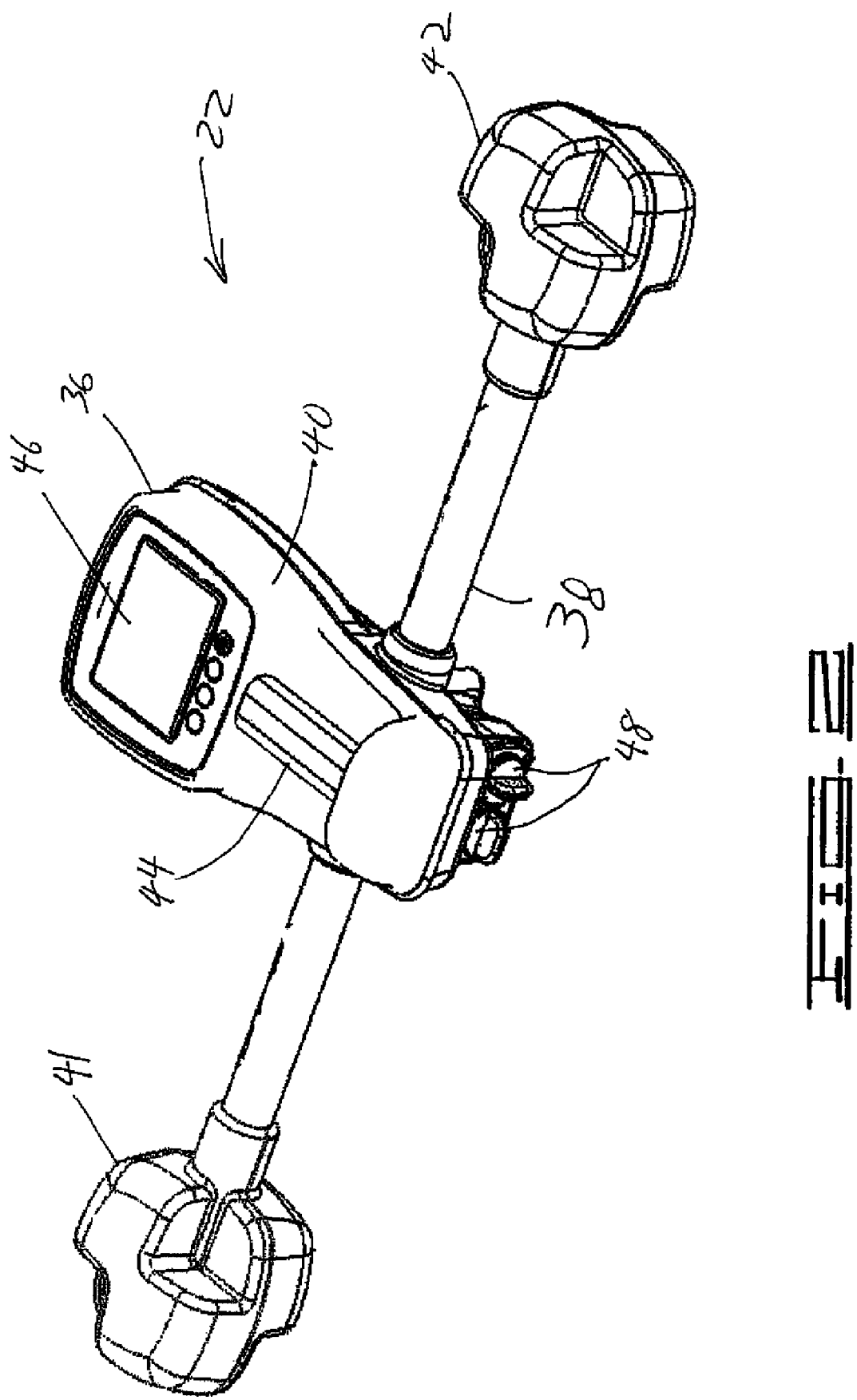

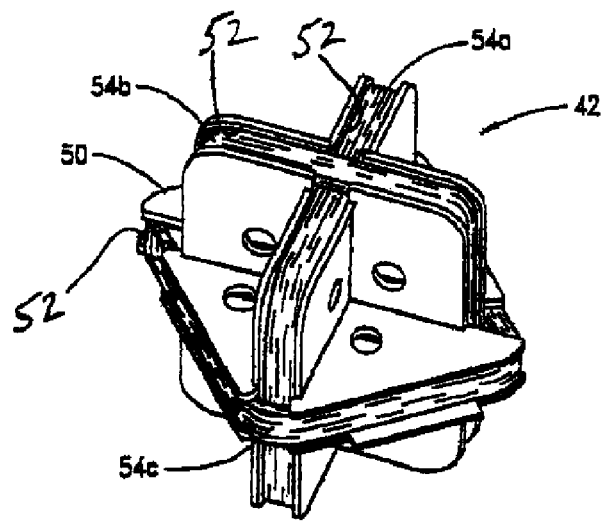
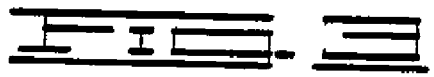
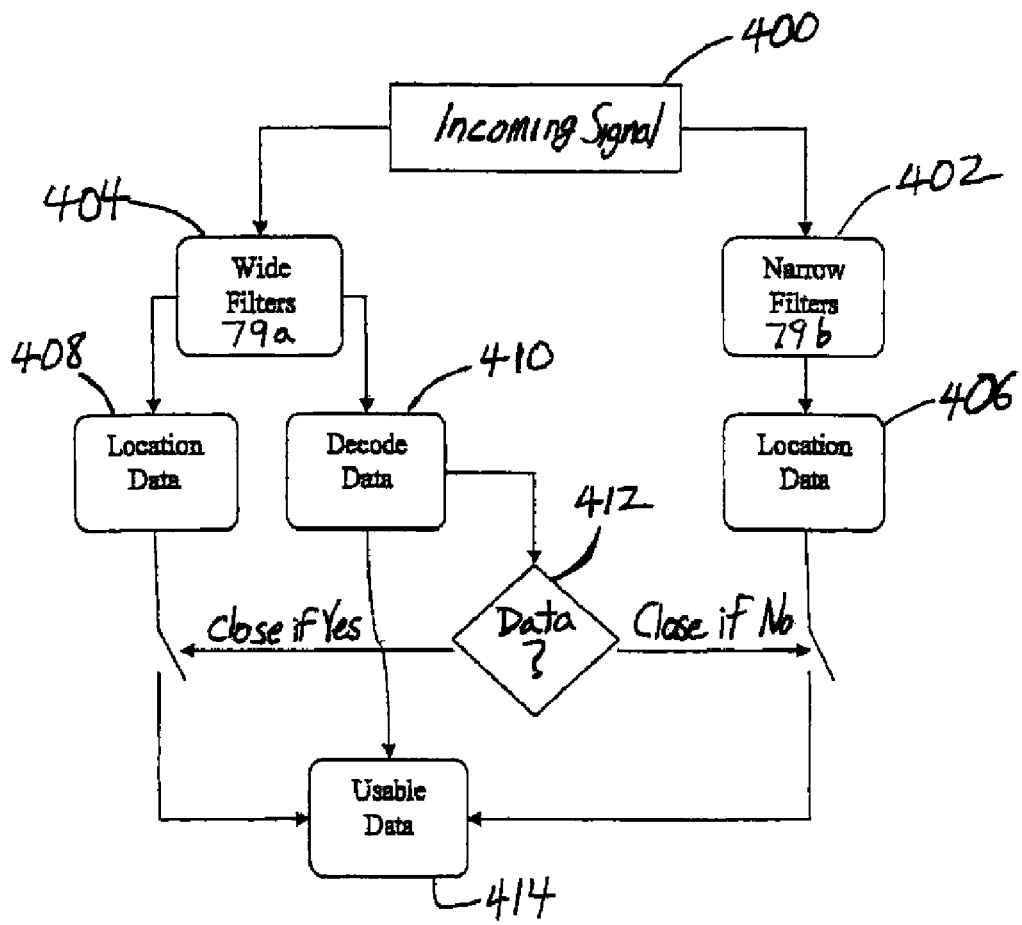
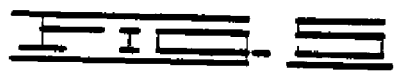

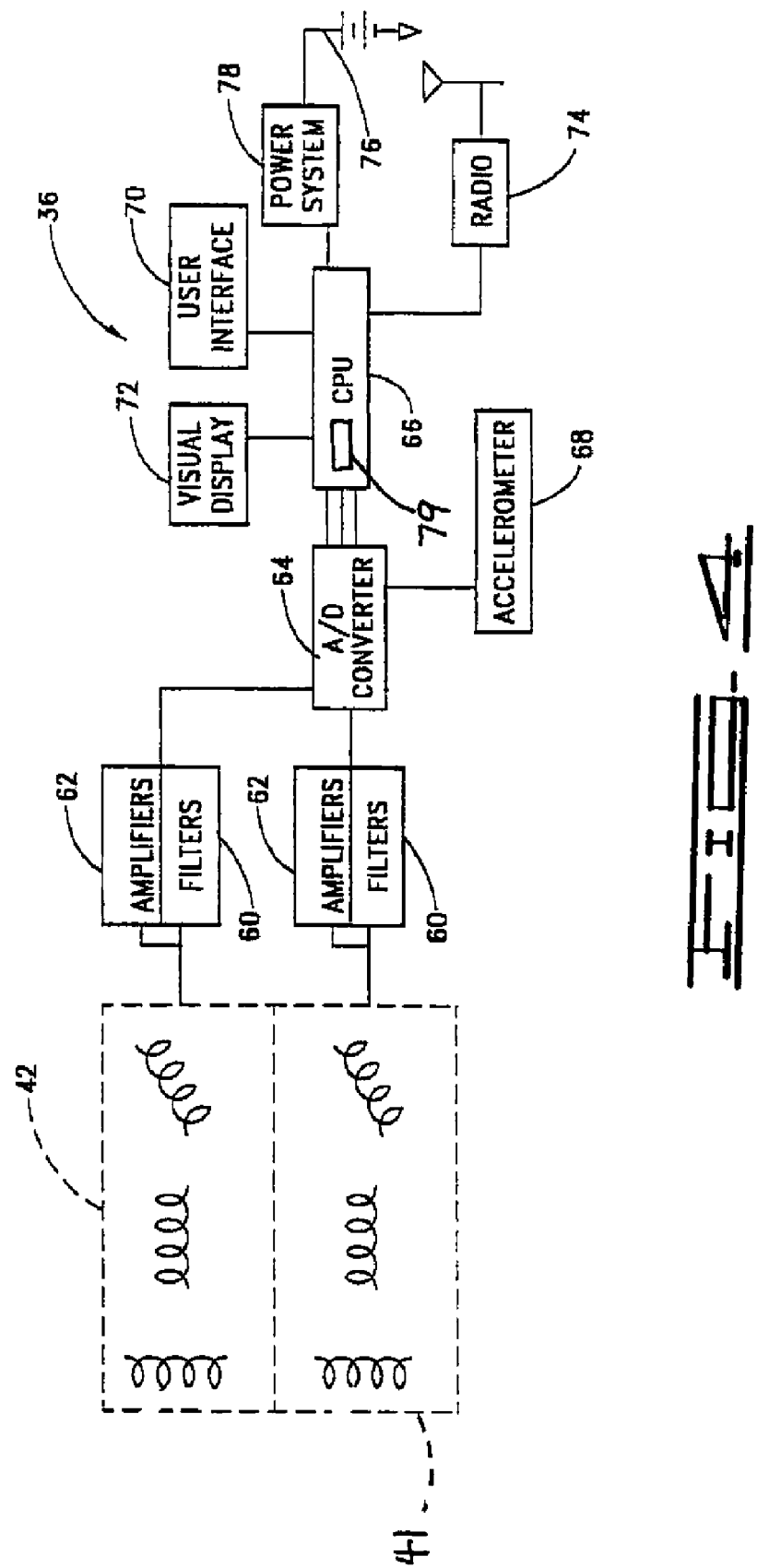

US 7,952,357 B2

RECEIVER SYSTEM FOR DETERMINING THE LOCATION OF A MAGNETIC FIELD SOURCE

FIELD OF THE INVENTION

The present invention relates generally to the field of locating underground objects, and in particular to locating and tracking a beacon or transmitter within the field of operation of a horizontal drilling machine.

SUMMARY OF THE INVENTION

The present invention is directed to a method for tracking a below ground source of a magnetic field. The method comprises maintaining a receiver assembly in a substantially horizontal plane, simultaneously detecting in three dimensions a magnetic field from a source at each of two distinct points of the receiver, moving the receiver in the horizontal plane until a flux angle measured at each of the two points is zero, and calculating a location of the source in three dimensions relative to the receiver using the detected field values.

The present invention is further directed to a receiver system for identifying a location of a magnetic field source. The receiver comprises a frame comprising a handle, two and only two tri-axial antennas supported by the frame and adapted to detect a magnetic field from a source, and a processor adapted to receive an antenna signal from each of the two antenna assemblies and to determine a location of the source relative to the frame using the antenna signals. The frame is adapted to maintain the two antennas in a substantially horizontal plane when the frame is held by the handle.

In an alternative embodiment the present invention is directed to a receiver system for detecting signals from a magnetic field source. The receiver comprises a frame, at least one antenna assembly supported by the frame and adapted to detect a magnetic field from a source, a first filter assembly adapted to receive a signal from the at least one antenna assembly and to output a first filtered signal, a second filter assembly adapted to receive the signal from the at least one antenna assembly and to output a second filtered signal, and a processor adapted to receive the first and second filtered signals from each of the two filter assemblies and to determine if data has been transmitted on the magnetic field from the source. The first filter assembly comprises at least one narrow band filter. The second filter assembly comprises at least one wide band filter.

In yet another aspect the present invention is directed to a method for guiding a downhole tool assembly toward and past a target. The method comprises setting a receiver assembly comprising two antenna assemblies disposed in a substantially horizontal plane at a target point, simultaneously detecting in three dimensions at each of the two antenna assemblies a magnetic field from a downhole tool assembly, and calculating a position of the downhole tool assembly in a vertical plane containing the borepath using the fields detected by the two antenna assemblies. The receiving assembly is positioned such that the two antenna assemblies each lie on the projected borepath of the downhole tool assembly.

BRIEF DESCRIPTION OF THE DRAWINGS

FIG. 1 is an illustration of a horizontal directional drilling system for drilling a horizontal borehole and a tracking system built in accordance with the present invention.

FIG. 2 is a perspective view of a receiver assembly constructed in accordance with the present invention.

FIG. 3 is a perspective, partially cut-away view of an antenna assembly for use with the present invention.

FIG. 4 is a block diagram of a portable area monitoring system constructed to detect and process signals emanating from a boring tool.

FIG. 5 is a flowchart illustrating a process for improved accuracy in determination of the location of a transmitter.

BACKGROUND OF THE INVENTION

Figure 6:
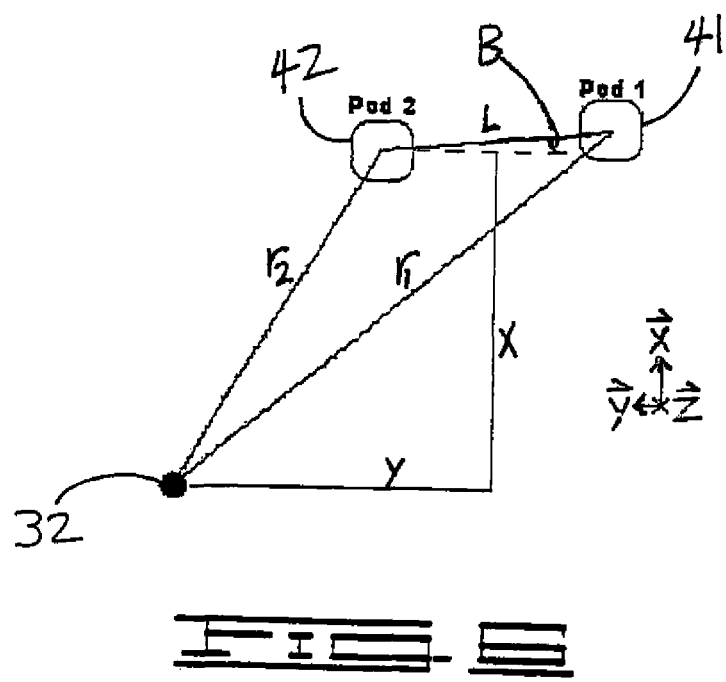
FIG. 6 is a geometrical representation of the relationship between a transmitter and a tilted receiver.

The horizontal directional drilling (HDD) industry traditionally uses walk-over tracking techniques to follow the progress of a bore or utility installation, to find the surface location immediately above a drill bit or backreamer, and to determine the depth of the drill bit or backreamer from that surface location. The primary tracking tools are a subsurface transmitter and a hand-carried surface receiver. The transmitter, located in or very near a boring tool or backreamer, generally emits a magnetic dipole field created by a single coil dipole antenna. The transmitted dipole field can be used for both location and communication with the above ground receiver.

Conventional receivers often contain an arrangement of three antennas mounted in each of the three Cartesian axes. When the antenna arrangement senses the dipole field, the output of each antenna is proportional to the magnitude of the magnetic flux density as detected along the axis of the particular antenna. The signals from the antennas are mathematically resolved to provide information about the relative location of the boring tool. The process of locating the dipole, and thus the boring tool, generally involves two steps: determining its location along the z-axis (fore and aft) and then along the y-axis (left and right). One skilled in the art will appreciate a receiver can locate a transmitter in the fore-aft direction (along the z-axis) using the amplitude and phase of the transmitter's generated horizontal and vertical field components as measured in the vertical plane normal to the surface and extending through the transmitter axis (the x-z plane). In situations where the transmitter is not in a horizontal plane, such that the pitch of the transmitter is not 0, the determined position of the transmitter may or may not be directly below the receiver. A receiver can also determine the location of a single transmitter in the left-right directions using the amplitude and phase of the dipole field in the horizontal plane (the y-z plane). However, the left-right determination can only be used either in front of or behind the transmitter because there is no y component to the dipole field when the receiver is directly above the transmitter (such that z=0). There is currently no satisfactory method of simultaneously locating the transmitter in both the fore-aft and left-right directions with an antenna arrangement positioned directly over the transmitter.

DESCRIPTION OF THE INVENTION

With reference now to the drawings in general, and FIG. 1 in particular, there is shown therein a horizontal directional drilling system ("HDD") system 10 for use with the present invention. FIG. 1 illustrates the usefulness of horizontal directional drilling by demonstrating that a borehole 12 can be made without disturbing an above-ground structure, namely a roadway or walkway as denoted by reference numeral 14. To cut or drill the borehole 12, a drill string 16 carrying a drill bit 18 is rotationally driven by a rotary drive system 20. When the HDD system 10 is used for drilling a borehole 12, monitoring the position of the drill bit 18 is critical to accurate placement of the borehole and subsequently installed utilities. The present invention is directed to a system 22 and method for tracking and monitoring a downhole tool assembly 24 during a horizontal directional drilling operation. Although the invention is shown with the system boring a borehole, the invention is equally applicable to a backreaming operation where the borehole is enlarged and prepared for the installation of the desired utility.

The HDD system 10 of the present invention is suitable for near-horizontal subsurface placement of utility services, for example under the roadway 14, building, river, or other obstacle. The tracking system 22 for use with the HDD system 10 is particularly suited for providing an accurate three-dimensional locate of the downhole tool assembly 24. The locating and monitoring operation with the present tracking system 22 is advantageous in that it may be accomplished in a single movement, or a minimum of coordinated movements, to a point above the drill bit 18. These and other advantages associated with the present invention will become apparent from the following description of the preferred embodiments.

With continued reference to FIG. 1, the HDD system 10 comprises the drilling machine 28 operatively connected by the drill string 16 to the downhole tool assembly 24. The downhole tool assembly 24 preferably comprises the drill bit 18 or other directional boring tool, and an electronics package 30. The electronics package 30 comprises a transmitter 32, or magnetic field source, for emitting a signal through the ground. Preferably the transmitter 32 comprises a dipole antenna that emits a magnetic dipole field. The electronics package 30 may also comprise a plurality of sensors 34 for detecting operational characteristics of the downhole tool assembly 24 and the drill bit 18. The plurality of sensors 34 may generally comprise sensors such as a roll sensor to sense the roll position of the drill bit 18, a pitch sensor to sense the pitch of the drill bit, a temperature sensor to sense the temperature in the electronics package 30, and a voltage sensor to indicate battery status. The information detected by the plurality of sensors 34 is preferably communicated from the downhole tool assembly 24 on the signal transmitted by the transmitter 32 using modulation or other known techniques.

With reference now to FIG. 2, shown therein is a preferred embodiment of the tracking system 22 of the present invention. The tracking system 22 comprises a receiver assembly 36. The receiver assembly 36 comprises a frame 38, a computer processor 40, and first and second antenna arrangements 41 and 42 supported by the frame. The processor 40 is supported on the frame 38 and operatively connected to the antenna arrangements 41 and 42. The frame 38 is preferably of lightweight construction and capable of being carried by an operator using a handle 44. In a preferred embodiment, the receiver assembly 36 also comprises a visual display 46 and a battery 48 for providing power to the various parts of the receiver assembly. The visual display 46 may be adapted to provide a visual representation of the tracking system 22 relative to the drill bit 13, or transmitter 32, and other information useful to the operator. The receiver assembly 36 may also comprise a transmitting antenna (not shown) for transmitting information from the receiver assembly to the drilling machine 10 or other remote system (not shown).

The antenna arrangements 41 and 42 are supported on the frame 38 and separated from each other by a known distance and in known relative positions. Preferably, the antenna arrangements 41 and 42 are positioned on the frame 38 so that when the frame is maintained in a substantially horizontal plane, the antennas will lie in the horizontal plane. More preferably, the antennas are separated by a distance of thirty (30) inches. Most preferably, the frame 38 will define an axis between the antenna arrangements 41 and 42. One skilled in the art will appreciate a greater distance or spread between the antennas will provide better resolution and accuracy. Other receiver configurations are also possible, as long as the antenna arrangements 41 and 42 are capable of isolating the magnetic field in each of the Cartesian axes at the point on the frame 38 where the antenna is positioned.

Each of the antenna arrangements 41 and 42 is preferably a tri-axial antenna. More preferably, the antennas 41 and 42 are adapted to measure the total magnetic field at their respective position on the frame 38. Preferably, each antenna 41 and 42 will comprise three orthogonal antennas which measure the magnetic field along their specific axis of sensitivity. Each of the signals detected by the three orthogonal antenna is squared, summed, and then the square root is taken to obtain the total field. This calculation assumes the sensitivities of each antenna are the same and that the center of each antenna is coincident with the other two such that the antenna arrangement is measuring the total field at a single point in space. Measurements and calculations are also simplified where the antennas 41 and 42 are oriented or aligned in the same way, relative to each other. However, if the antennas 41 and 42 are not pointed in the same direction, adjustments can be made to the calculations to compensate for the alignment difference.

Referring now to FIG. 3, there is shown therein the preferred embodiment for the antennas 41 or 42 for use with the present invention. The antenna 42 comprises a support structure 50 defining three channels 52 for each of three receiving coils 54a, 54b, and 54c. The support structure 50 is preferably formed of lightweight plastic and manufactured in such a way that the three channels 52 are each dimensionally identical. More preferably, the support structure 50 has a substantially cubical shape and each of the three channels 52 defines a rectangular aperture area having a center point. Most preferably, the channels 52 are mutually orthogonal and oriented so that the center points are coincident. Due to the channel configuration, the coil loops 54 all have coincident center points, and their sensitivities are substantially identical. An antenna arrangement suitable for use with the present invention is more fully disclosed in commonly assigned U.S. patent application Ser. No. 11/382,644, the contents of which are incorporated herein by reference. One skilled in the art will appreciate other embodiments for the tri-axial antennas 41 and 42, such as ferrite rods or printed circuit boards, may be used.

With reference now to FIG. 4, shown therein is a block diagram of the preferred embodiment of the receiver assembly 36 of the present invention. The antenna arrangements 41 and 42, as described earlier, measure a change in the magnetic field from the source transmitter 32. A change in the magnetic field sensed will result in a voltage being induced in response to the transmitter's 32 magnetic field. The voltages from the antennas 41 and 42 are sent to filters 60 and amplifiers 62. Filters 60 eliminate the effects of other signals received by the antennas 41 and 42 from local noise sources. Amplifiers 62 increase the signal received by the antennas 41 and 42. An A/D converter 64 is used to convert analog waveform information into digital data.

The digital data from the A/D converter 64 is then sent to a central processor 66 (CPU) to calculate the location of the transmitter 32 relative to the receiver assembly 36. The CPU 66 may comprise a digital signal processor (DSP) and a microcontroller. The CPU 66 decodes the information from the A/D converter 64 and performs calculations to determine the location of the transmitter in a manner yet to be described. The CPU 66 may also discern information transmitted on the magnetic field, to determine the battery status, pitch, roll, and other information about the downhole tool assembly 24.

The receiver assembly 36 may also comprise one or more sensors 68 used to sense operational information about the receiver assembly 36. For example, one or more accelerometers, or other known inclination and orientation sensors or magnetic compasses, may provide information concerning the roll or tilt of the receiver 36. Information from the sensors 68 is provided to the A/D converter 64 and to the CPU 66 where the DSP may make calculations to compensate for the receiver 36 not being maintained precisely in the horizontal plane.

In the preferred embodiment the receiver assembly 36 further comprises a user interface 70 having a plurality of buttons, joysticks, and other input devices. The operator can input information for use by the CPU 66 through the user interface 70. Information entered through the user interface 70 or determined or used by the CPU 66 may be displayed to the operator on the visual display 72 screen. The receiver assembly 36 also comprises a radio antenna 74 for transmitting information from the CPU 66 to a remote unit, such as at the drilling machine 10.

The receiver 36 is preferably powered by a battery assembly 76 and power regulation system 78. The battery assembly 76 may comprise multiple C-cell sized batteries, though other sources are contemplated, such as rechargeable batteries, solar panels or fuel cells. The power regulation system 78 may comprise a linear regulator or switch mode regulator to provide power to the various components of the receiver 36.

The present invention also contemplates a method and filter arrangement for improving accuracy and processing of communications and signals received by the antennas 41 and 42. A preferred method of communication of information from the transmitter 32 is a combination of On-Off Keyed ("OOK") communication and Differential Phase Shift Keying ("DPSK") communication. In the preferred method, a synchronization sequence involves turning off the signal from the transmitter 32 for a brief interval. The receiver 36 is preferably programmed to recognize the 'off' time in the present scheme as the synchronization period and provides an opportunity for the receiver to measure the noise floor. The 'off' time is preferably a sufficient time for the receiver 36 to measure the noise floor. The bit rate for the present communication scheme is preferably very near the optimal bit rate required to send data from the transmitter 32. Subsequently, traditional DPSK communication is preferably used to transfer information from the transmitter 32 to the receiver 36. The present communication scheme is further beneficial because the transmitter 32, with the exception of the synchronization period, is always transmitting a signal to the receiver 36 and the receiver can therefore locate the transmitter substantially continuously.

An example of a transmission with the communication scheme of the present invention would comprise a packet of 1 second duration. The packet preferably begins with a 50 ms period during which the transmitter 32 does not transmit and is 'off'. The transmitter 32 would then be turned on for a 50 ms period, during which no phase shifts are permitted so that the phase reference can be generated and recognized by the receiver 36. Subsequently, DPSK is used, preferably at 60 bps, to transmit the remaining 54 bits effectively. The receiver 36 will preferably parse the packet as 10 6-bit non-zero characters. More preferably, the first 6-bit character is treated as the synchronization sequence, followed by 9 6-bit characters of data. The protocol for the characters can be structured in any convenient manner to transmit information such as roll, pitch, temperature, etc.

In an alternative method of communicating and transmitting information from the transmitter 32, the rotation of the downhole tool assembly 24 is ceased and the tool assembly and the transmitter are held at a constant roll position. Preferably, the tool assembly 24 and transmitter 32 are rotated to a predetermined roll angle and allowed to remain stationary for a predetermined amount of time. More preferably, the transmitter 32 will be allowed to remain stationary for at least five seconds. If the transmitter 32 remains at the predetermined roll angle for the period of time, the transmitter 32 may be programmed to stop communication and transmit a simple carrier signal with no modulation. When the transmitter 32 is again rotated, communication of information on a modulated signal is resumed. Alternatively, when the transmitter 32 is maintained in a constant roll position, the transmitter may send unmodulated roll characters. An unmodulated character would indicate to the receiver 36 that depth measurements can be taken more accurately while the unmodulated character is being transmitted. The receiver 36 also may adjust filter characteristics to change the frequency response for the received signal during the transmission of an unmodulated character.

For improved reception and detection of signals from the transmitter 32, the receiver 36 comprises two parallel sets of digital signal processing ("DSP") filters 79 (shown in FIG. 4), implemented in the processor 66. Although software implemented DSP filers are discussed here, the invention also contemplates a hardware filter implementation. A first set of filters 79a preferably comprises wide bandwidth filters. A second set of filters 79b preferably comprises narrow bandwidth filters. The narrow bandwidth filters 79b will preferably have a bandwidth of approximately 10 Hz. The wide bandwidth filters 79a will preferably have a bandwidth range of 125-200 Hz, and are used to decode information from a modulated signal and to perform calculations for location of the transmitter 32. When the transmitter 32 radiates only a carrier signal, the determination of the location of the transmitter is based solely on the output of the narrow filters 79b. The wide bandwidth filters 79a would again be used for location when the transmitter 32 begins communication and the wide bandwidth filters detect the transmitted signal. The wide bandwidth filters 79a can be used to validate communications, ignoring random noise and identifying synchronization characters.

Referring now to FIG. 5, there is shown therein a flowchart illustrating the use of the multiple DSP filters 79a and 79b by the processor 66. The signal from the transmitter 32 is depicted as reaching the filters at 400. The signal is received by the narrow filters 79b at 402 and the wide filters 79a at 404. The narrow filters 79b retrieve location data only at 406. The wide filters 79a retrieve location data at 408 and decoded information at 410. If decoded information is found to be present at 412, the processor 66 in the receiver 36 recognizes that the location data from the wide filters 79a at 408 is to be used at 414. If no information is found at 412, the location data from the narrow filters 79b at 406 is used by the processor 66 at 414. One skilled in the art will appreciate the use of two sets of filters as described herein provides the benefit of having more signal noise removed such that the accuracy of location measurements will be improved.

The receiver assembly 36 of the present invention uses the magnetic field measurements from the antenna arrangements 41 and 42 to direct movement of the receiver. By appropriate movement, the receiver 36 may accurately locate the transmitter 32 in three-dimensional (3-D) space relative to the receiver. Each antenna arrangement 41 and 42 obtains three distinguishable orthogonal components of a magnetic field available at any position. In the preferred embodiment described above, the three antennas in each arrangement 41 and 42 provide those magnetic field measurements.

The receiver assembly 36 may be used to locate the transmitter 32 in three-dimensional (3-D) space. When in the area of the transmitter 32, the receiver 36 is used to find the transmitter plane (the y-axis, where z=0) by using the flux angles as measured at the antennas 41 and 42. When the flux angles are 0 in both of the antennas 41 and 42, the receiver 36 is positioned in the transmitter plane and the location of the transmitter 32 relative to the receiver can be determined. One skilled in the art will appreciate the flux angle measurement of 0 indicates the flux angle at the antennas 41 and 42 is the same as the pitch of the transmitter 32 with respect to the horizontal plane; indicating that the receiver 36 is in the transmitter plane (y-axis, where z=0). Preferably, the location of the transmitter 32 is determined with the transmitter at the origin of the x-y-z coordinate system. For purposes of this invention, the z-axis is designated as being along the axis of the transmitter 32, the y-axis is designated as the horizontal axis perpendicular to the transmitter's axis, and the x-axis is designated as the vertical axis perpendicular to the transmitter's axis. Thus, the z-axis is a measure of fore-aft, the y-axis is a measure of left-right, and the x-axis is a measure of depth.

In the preferred embodiment, and particularly in situations when the operator has a general idea of the location of the boring tool 24 and the borepath 12, the receiver 36 is used as follows. The receiver assembly 36 is held with the axis between the antenna arrangements 41 and 42 substantially perpendicular to the suspected borepath 12. Preferably, the receiver 36 is also held in a substantially horizontal plane, though calculations may be used to compensate for any tilt of the receiver. More preferably, the receiver 36 will be allowed to deviate from the horizontal plane by no more than twenty degrees (20°). The receiver 36 is then advanced along the suspected borepath 12 until the flux angle measurement with respect to each antenna 41 and 42 is zero (0).

With the receiver 36 in the transmitter 32 plane, the location of the transmitter 32 relative to the receiver can be determined using the geometry of FIG. 6 and known equations. From the measurements and calculations, for example, the operator can be provided with the left-right offset distance of the receiver 36 to a point above the transmitter 32. The receiver 36 can also be moved left or right until the total fields measured by the antennas 41 and 42 are the same. When the total fields measured by the antennas 41 and 42 are the same and the flux angle measurement with respect to each antenna 41 and 42 is zero, the receiver 36 will be located directly above the transmitter 32 (at the point where y=z=0). Repeating slight movements of the receiver 36 to ensure the null field measurements (magnetic field measurements taken along the x-axis) are zero and the total field measurements are maximized will allow a more accurate indication of the position of the transmitter 32. Accurate depth determination of the transmitter 32 can be made when the receiver 36 is directly above the transmitter. In the preferred embodiment, the signal status or magnitude of the antennas 41 and 42 is communicated to the operator via the display 72 Antenna 41 and 42 information may be communicated in numerical format or with other graphical techniques, such as a virtual bubble level.

As previously discussed, the receiver 36 may contain sensors 68 to account for tilt or pitch of the receiver and enable the calculation of β. Calculations may also be used to compensate for the pitch of the transmitter 32. Also, as discussed in the procedure above, the value of y will be 0 where the total field magnitudes in the antennas 41 and 42 were found to be equal. However, one skilled in the art will appreciate that the value of y may be determined from the geometry if the fields were not balanced or if the receiver 36 was moved slightly in subsequent steps.

The location of the receiver 36 relative to the transmitter 32 can be accomplished with direct solution of the field equations. The magnetic field equations for the system are:

$$B_{T,i} = k \cdot \frac{\sqrt{3z_i^2 + r_i^2}}{r_i^4} \quad \text{and}$$

$$B_{x,i} = 3k \cdot \frac{x \cdot z_i}{r_i^5} \quad \text{where } r_i^2 = x^2 + y_i^2 + z_i^2.$$

Figure 7:
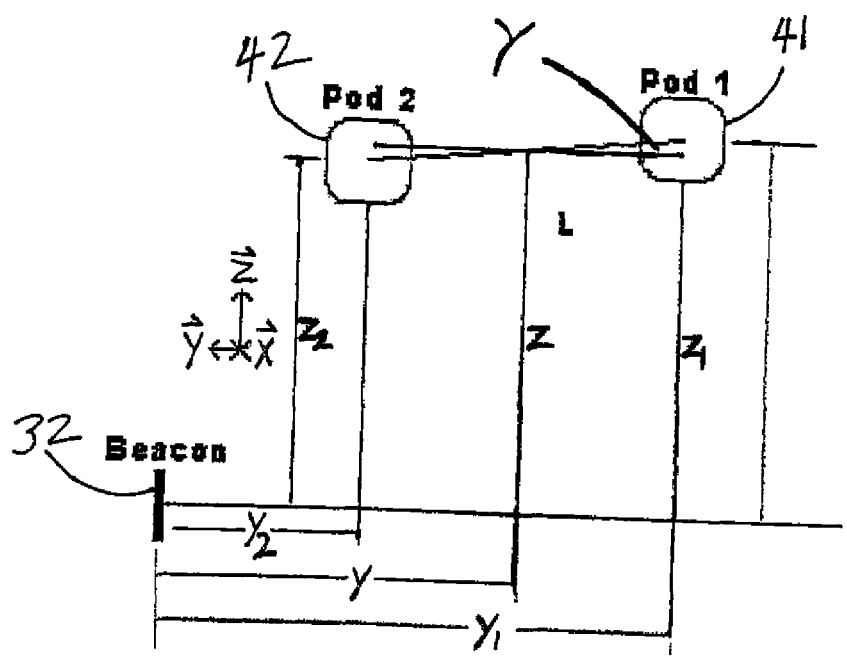
FIG. 7 is another geometrical representation of the relationship between a transmitter and a tilted receiver.

From FIG. 7, illustrating the relationships between $y_i$ and $z_i$, we have the following equations:

$$y_1 = y + \frac{L}{2} \cdot \cos(\gamma) \quad z_1 = z + \frac{L}{2} \cdot \cos(\gamma)$$
$$y_2 = y - \frac{L}{2} \cdot \cos(\gamma) \quad z_2 = z - \frac{L}{2} \cdot \cos(\gamma)$$

The system of equations can now be solved to determine the location of the transmitter 32 relative to the receiver 36. In solving the equations, indiscretions in the signs of y and z may be discovered. However, the indiscretions in these signs can be found by turning the receiver 36 to determine which antenna arrangement 41 or 42 is detecting the greatest total magnetic field magnitude. If the receiver 36 is turned along the z-axis, the field magnitude reading can be used to determine if the receiver is in front of or behind the transmitter 32. Turning the receiver 36 along the y-axis, the field magnitude reading can be used to determine if the receiver is to the left or right of the transmitter 32. This information can be provided to the receiver 36 so that appropriate calculations can be made. Alternatively, a procedure for use of the receiver 36 can be proscribed to indicate when the receiver is being held on the y-axis or z-axis so that the receiver can make the determination of the appropriate signs for y and z in the above system of equations.

The present invention also contemplates a novel technique for calibrating the receiver 36 to the transmitter 32 where a calibration constant k is required. Preferably, the receiver frame is placed on the ground with the axis between the antennas 41 and 42 perpendicular (along the z=0 plane) to the transmitter 32 axis. The distance the receiver 36 is placed from the transmitter 32 need not be specified. Magnetic field measurements are then taken by the antennas 41 and 42. Using known magnetic field equations and the known distance between the antennas, a constant k can be determined for use with the receiver in subsequent measurements.

With both antennas 41 and 42 perpendicular to the transmitter 32 axis and separated by some distance L, the measured field at each antenna pod can be written as $$B_n = \frac{k}{d^3} \text{ and } B_f = \frac{k}{(d+L)^3},$$

where $B_n$ is the field measured at the antenna nearest to the transmitter and $B_f$ is the field measured at the antenna furthest from the transmitter. The distance, d, from the nearest antenna 41 or 42 to the transmitter 32, can be solved for using the following equation:

$$\frac{L\sqrt[3]{\frac{Bf}{Bn}}}{\left(1 - \sqrt[3]{\frac{Bf}{Bn}}\right)} = d$$

The constant k can then be calculated by again using the magnetic field equations for $B_n$ or $B_f$.

In an alternative embodiment, the receiver 36 of the present invention can be used to find the location of the transmitter 32 even if the general location of the transmitter or the borepath 12 is not known. For locating the transmitter 32 in such a situation, the receiver 36 is first rotated in a horizontal plane until the signal strength received at each antenna 41 and 42 is the same. The receiver 36 is then rotated 90° and moved in the direction defined by the axis between the antenna arrangements 41 and 42 until the signal strength received at each antenna 41 and 42 is again the same. At this point, the receiver 36 is proximate a point above the transmitter 32 and the procedure described above for locating the transmitter when the transmitter location and borepath 12 are generally known can be used to pinpoint the location of the transmitter.

The present invention can therefore be used to identify the exact coordinates of the receiver 36 relative to the transmitter 32 using the magnetic field measurements from the plurality of antenna arrangements 41 and 42 and the procedures and equations above. The information concerning the location of the transmitter 32 is preferably provided to the operator using the visual display 72. The processes described herein allow the receiver assembly 36 to be used to locate the downhole tool assembly 24 and transmitter 32 quickly and accurately, with few steps and little computation.

Figure 8:
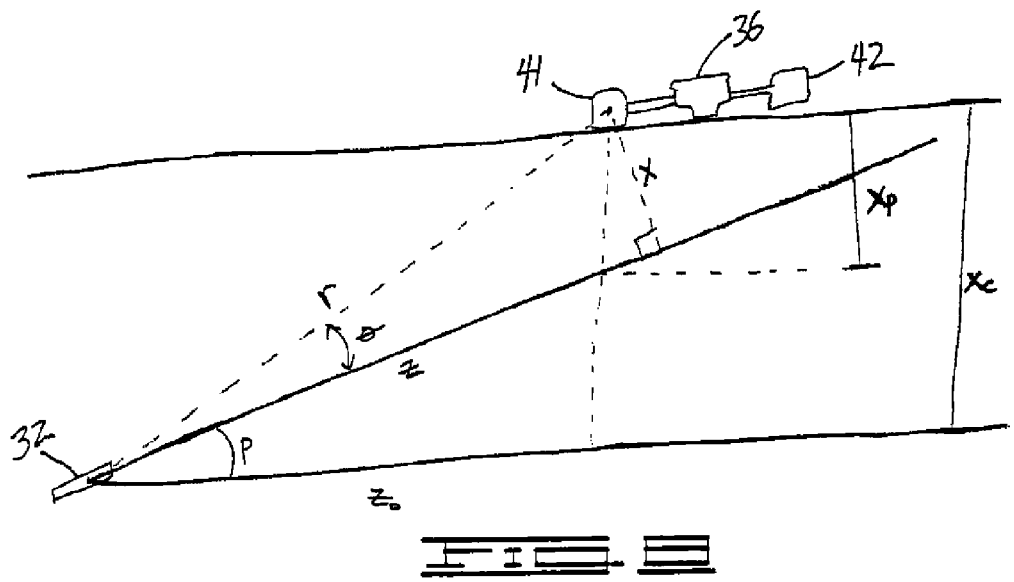
FIG. 8 is graphical representation of the relationship between a receiver and a transmitter for an alternative method of using the receiver.

With reference now to FIG. 8, an alternative embodiment for use of the present invention is shown. In the alternative embodiment, the receiver 36 is contemplated for use as a target for the boring tool assembly 24. As shown in FIG. 8, the receiver 36 is placed on the ground at a target point in front of the tool assembly 24. Preferably, the receiver 36 is positioned so that each antenna assembly 41 and 42 is on the desired borepath 12. With information provided by the receiver 36 for use by the operator, the operator can direct the tool assembly 24 in order to bore to or through the point where the receiver is positioned or a point determined by the receiver, such as a point at a particular depth below the receiver. Using the receiver 36 as a target can also prove beneficial for guiding the downhole tool assembly 24 to a desired point after the tool assembly has been steered on a dead-reckoning course under an obstacle, such as a building, river, or road, where precise tracking of the borepath has not been possible.

The information provided to the operator preferably includes left/right steering guidance, current depth ($x_c$), projected depth ($x_p$) at the target point where the receiver 36 is positioned, and horizontal offset distance ($z_0$) to the receiver. For determining the left/right direction, the flux angles of the fields measured by the antennas 41 and 42 may be used. With information provided to the operator, the operator can steer the tool assembly 24 in the direction of the flux angle and the assembly will begin moving toward the vertical plane containing the receiver, and consequently toward the borepath 12.

Using the geometry shown in FIG. 8, the position of the downhole tool assembly 24 in a vertical plane containing the borepath 12 can be calculated and provided to the operator. The position of the downhole tool assembly 24 preferably comprises a depth ($x_c$) of the downhole tool assembly and offset horizontal distance ($z_0$) to the downhole tool assembly. Preferably, the receiver 36 may assume that the drilling tool 24 is in the vertical plane of the desired borepath 12, thus making calculations simpler and within reasonable accuracy. The following formulas can be used to provide the desired information:

Solve for θ from:

$$\varphi = \tan^{-1}\left(\frac{B_x}{B_z}\right) = \tan^{-1}\left(\frac{3\sin\theta\cos\theta}{3\cos^2\theta - 1}\right),$$

where φ is calculated as the arctangent of the signal strengths of the antennas 41 and 42 (rotated due to the pitch of the transmitter 32 and rotation of the receiver 36).

Figure 9:
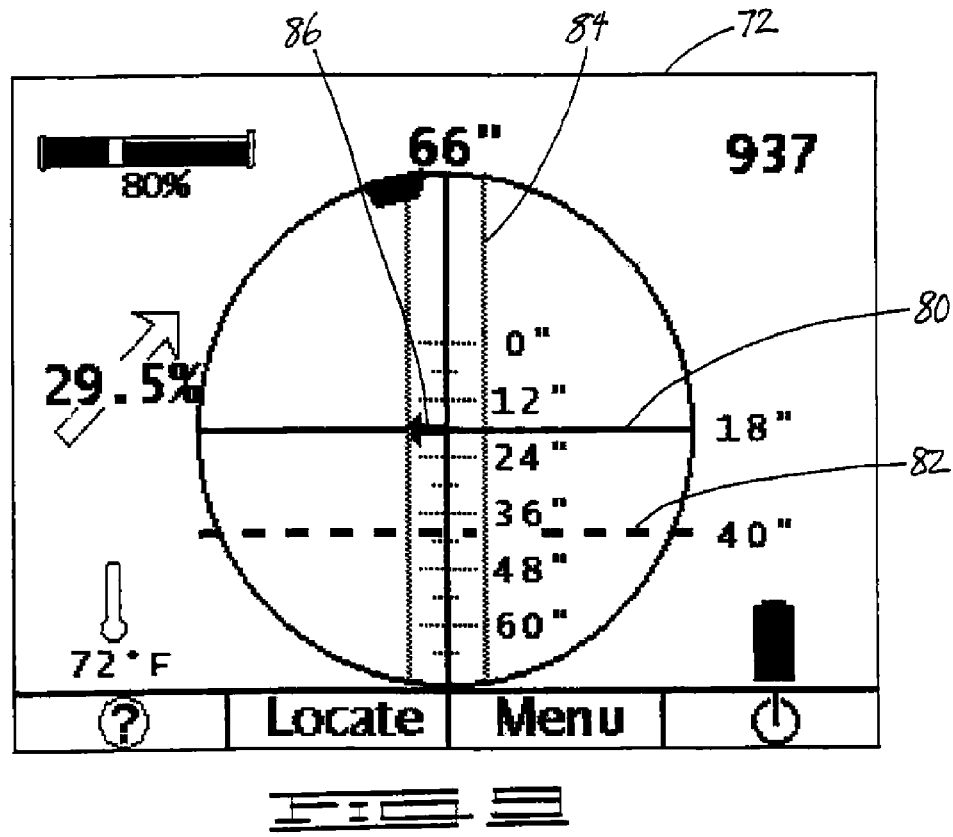
FIG. 9 is graphical representation of a preferred embodiment for the display of the receiver when the receiver is used in the method of FIG. 8.

Current depth: $x_c = r \cdot \sin(\theta + P)$
Projected depth: $x_p = x_c - r \cdot \cos(\theta + P) \cdot \tan(P)$
Horizontal offset: $z_0 = r \cdot \cos(\theta + P)$ With two antennas 41 and 42 available, the receiver 36 can visually provide for the operator an indication of the downhole tool assembly's 24 progress toward, and ultimately away from, the receiver. In the preferred embodiment, the information is graphically displayed at the display 72. With reference now to FIG. 9, there is shown therein a representation of a preferred embodiment for the display 72 of the receiver 36. The display 72 comprises a solid horizontal line 80 that forms part of a crosshair on the display to indicate the projected depth of the transmitter 32 when the transmitter, or downhole tool assembly 24, reaches the target point. A dashed horizontal line 82 is indicative of the transmitter's 32 current depth. Vertical dashed lines 84 show the horizontal offset of the transmitter 32 from the receiver 36. The left/right direction, and magnitude if desired, is shown by a scaled arrow 86 along a middle portion of the crosshair. Other status information such as transmitter 32 pitch, roll position, and battery status, tool assembly 24 temperature, and receiver 36 battery status may also be provided for operator information and use.

Various modifications can be made in the design and operation of the present invention without departing from its spirit. Thus, while the principal preferred construction and modes of operation of the invention have been explained in what is now considered to represent its best embodiments, it should be understood that within the scope of the appended claims, the invention may be practiced otherwise than as specifically illustrated and described.

The invention claimed is:

1. A receiver system for identifying a location of a magnetic field source, the receiver comprising:
   a frame;
   two and only two tri-axial antennas supported by the frame to detect a dipole magnetic field from the magnetic field source;
   an orientation sensor to sense an orientation of the frame; and a processor to receive an antenna signal from each of the two antenna assemblies and to determine the location of the magnetic field source relative to the frame using the antenna signals and the orientation of the frame;

wherein the two antennas detect the dipole magnetic field when the antennas are held in a substantially horizontal plane.

2. The receiver system of claim 1 wherein the orientation sensor is an accelerometer.

3. The receiver system of claim 1 wherein the processor determines the location of the magnetic field source by using the orientation of the frame to adjust for an effect of pitch on the antenna assemblies.

4. The receiver system of claim 1 wherein the antenna assemblies comprise tri-axial antennas.

5. The receiver system of claim 4 wherein each of the tri-axial antennas comprises:

a first winding defining an aperture area;

a second winding defining an aperture area; and a third winding defining an aperture area.

6. The receiver system of claim 5 wherein the aperture area of each winding is the same; and wherein the windings have a common center point.

7. The receiver system of claim 1 wherein the antennas are positioned at opposite ends of the frame.

8. The receiver system of claim 7 wherein the antennas are maintained in a substantially horizontal plane.

9. The receiver system of claim 8 wherein the antennas are approximately 30 inches apart.

10. The receiver system of claim 1 wherein the frame comprises a handle.

11. The receiver system of claim 10 wherein the frame is configured to maintain the two antennas in a substantially horizontal plane when the frame is held by the handle.

* * * * *